(12) United States Patent
Lin

(10) Patent No.: US 10,962,873 B2
(45) Date of Patent: Mar. 30, 2021

(54) EXTREME ULTRAVIOLET MASK AND METHOD OF MANUFACTURING THE SAME

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 192 days.

(21) Appl. No.: 15/967,133

(22) Filed: Apr. 30, 2018

(65) Prior Publication Data

US 2019/0101817 A1    Apr. 4, 2019

Related U.S. Application Data

(60) Provisional application No. 62/565,714, filed on Sep. 29, 2017.

(51) Int. Cl.
*G03F 1/38* (2012.01)
*G03F 1/22* (2012.01)
*G03F 1/54* (2012.01)
*G03F 1/24* (2012.01)

(52) U.S. Cl.
CPC ............ *G03F 1/22* (2013.01); *G03F 1/24* (2013.01); *G03F 1/38* (2013.01); *G03F 1/54* (2013.01)

(58) Field of Classification Search
CPC ............... G03F 1/24; G03F 1/38; G03F 1/54
See application file for complete search history.

(56) References Cited

U.S. PATENT DOCUMENTS

| | | | |
|---|---|---|---|
| 6,288,905 B1 * | 9/2001 | Chung | B32B 3/08 361/771 |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |

(Continued)

*Primary Examiner* — Daborah Chacko-Davis
(74) *Attorney, Agent, or Firm* — McDermott Will & Emery LLP

(57) ABSTRACT

A method of manufacturing an extreme ultraviolet mask, including forming a multilayer Mo/Si stack including alternating Mo and Si layers over a first major surface of a mask substrate, and forming a capping layer over the multilayer Mo/Si stack. An absorber layer is formed on the capping layer, and a hard mask layer is formed over the absorber layer. The hard mask layer is patterned to form a hard mask layer pattern. The hard mask layer pattern is extended into the absorber layer to expose the capping layer and form a mask pattern. A border pattern is formed around the mask pattern. The border pattern is extended through the multilayer Mo/Si stack to expose the mask substrate and form a trench surrounding the mask pattern. A passivation layer is formed along sidewalls of the trench.

20 Claims, 9 Drawing Sheets

(56) References Cited

U.S. PATENT DOCUMENTS

| | | | |
|---|---|---|---|
| 2005/0080286 A1* | 4/2005 | Wang | H01L 21/02271 556/410 |
| 2014/0051015 A1* | 2/2014 | Gallagher | G03F 1/24 430/5 |
| 2017/0263444 A1* | 9/2017 | Shoki | G03F 1/54 |

* cited by examiner

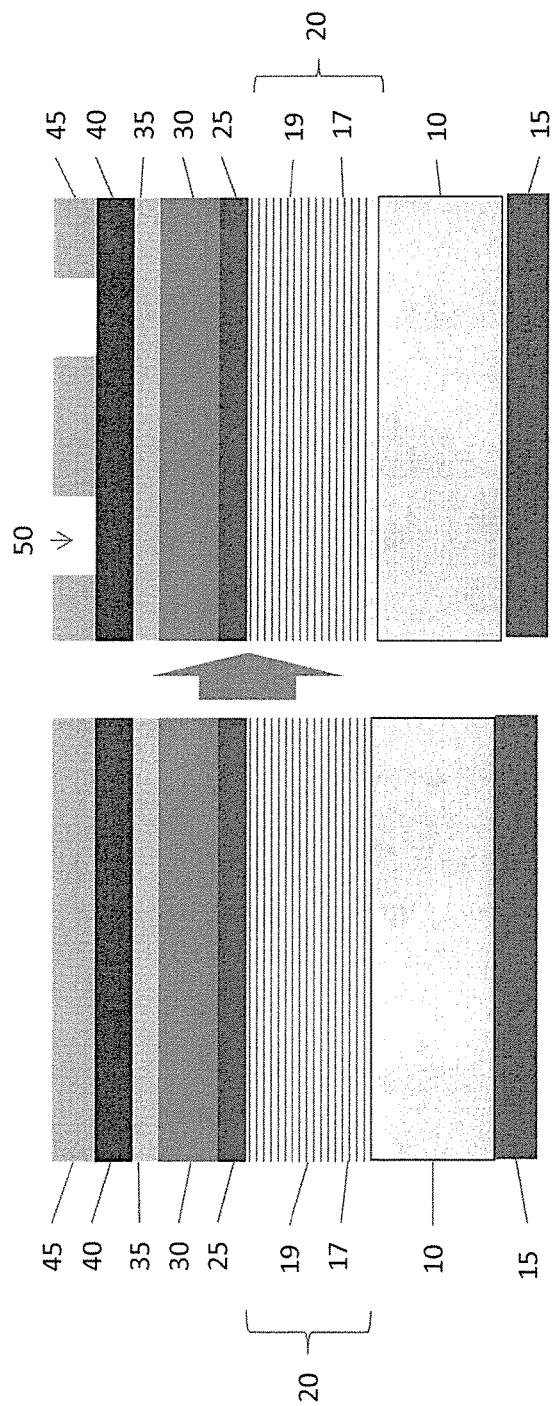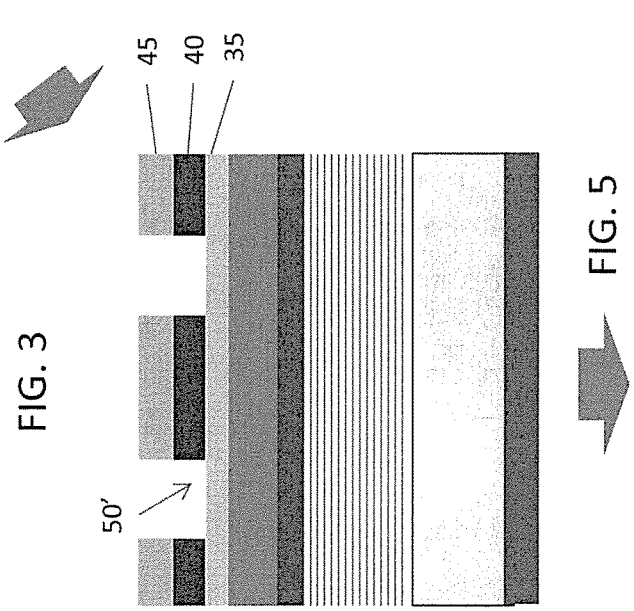
FIG. 3
FIG. 4
FIG. 5

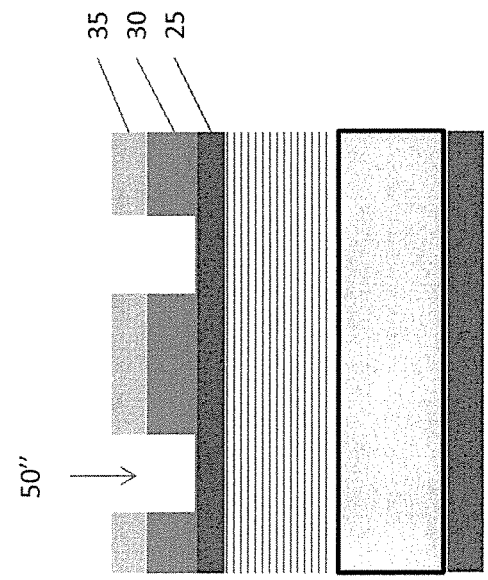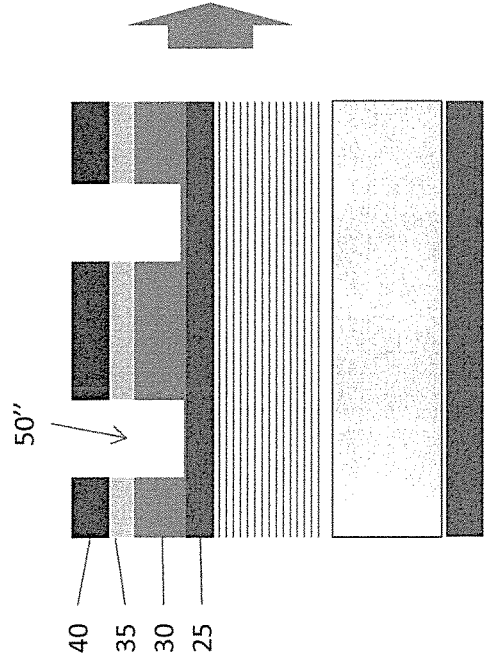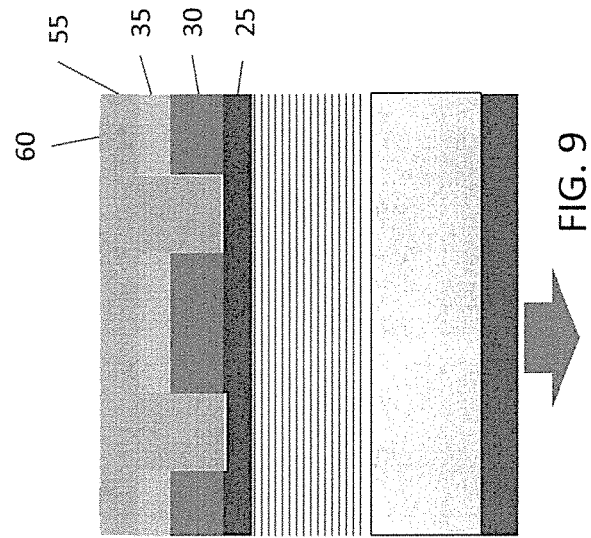

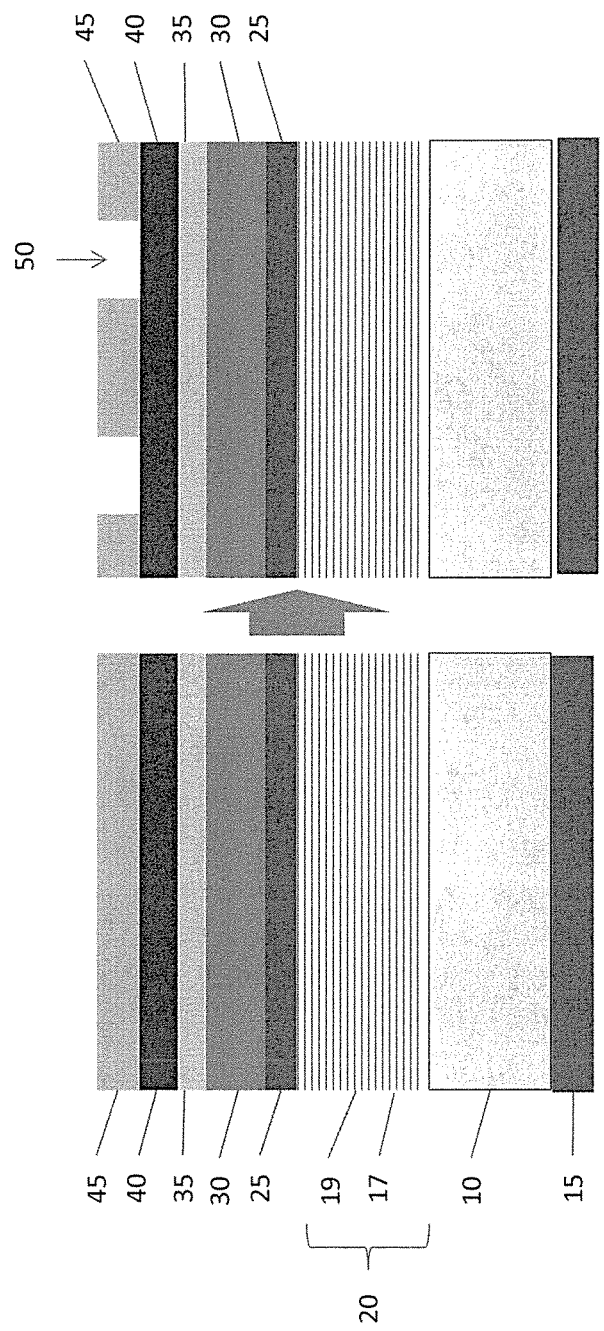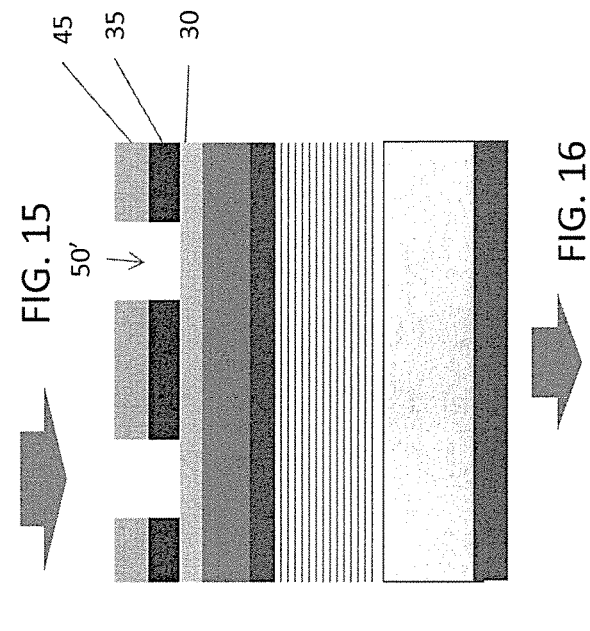

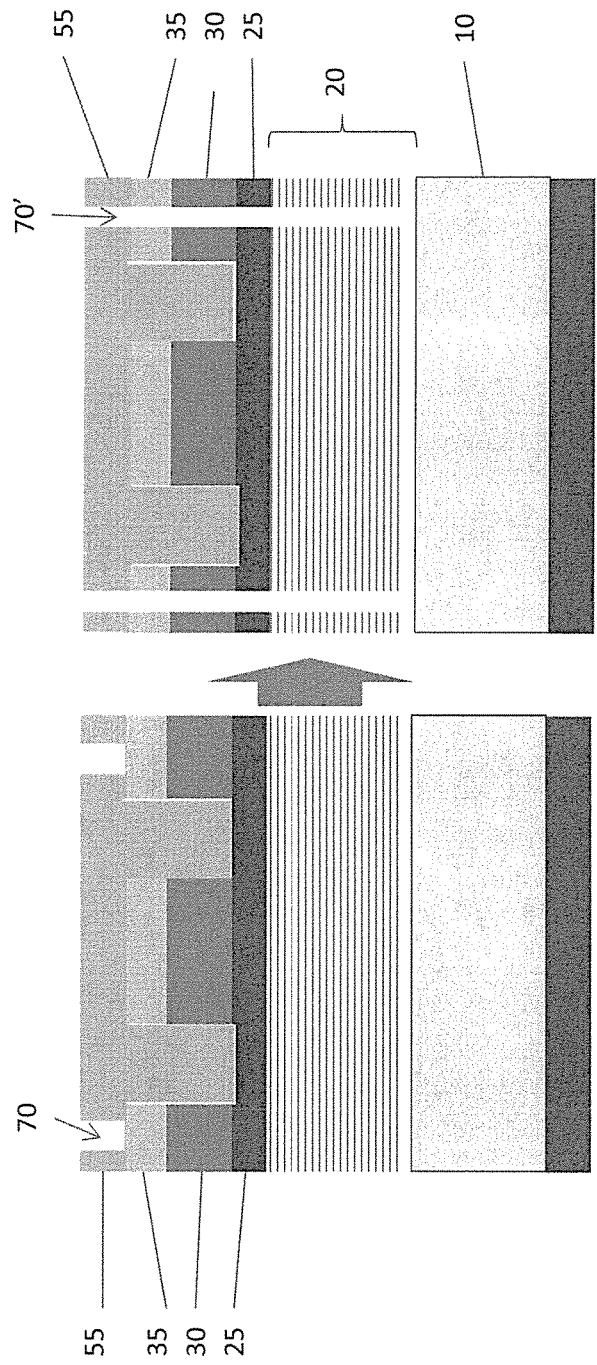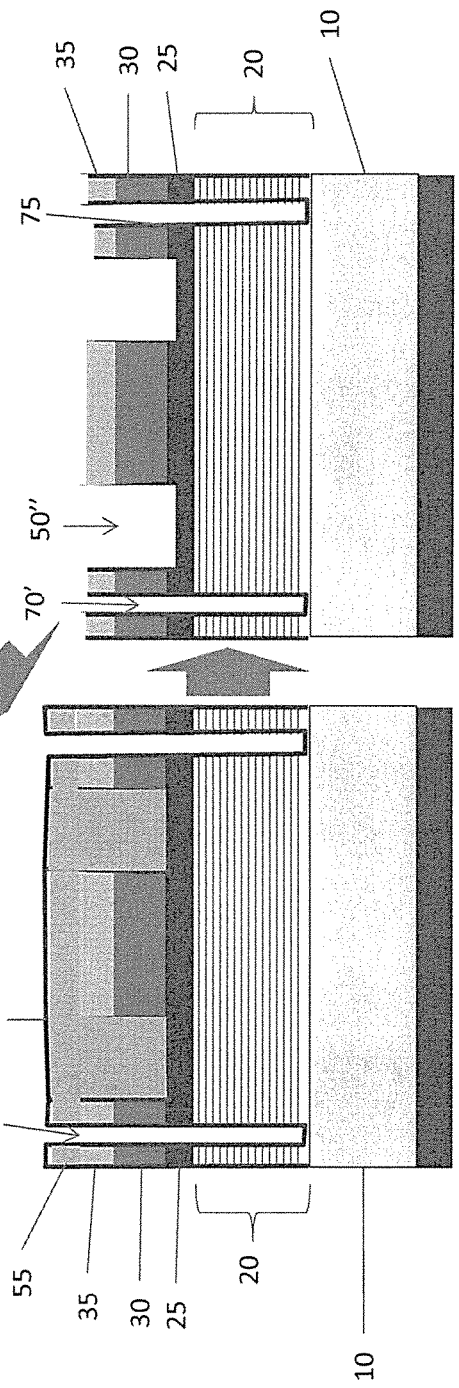
FIG. 21
FIG. 22
FIG. 23
FIG. 24

EXTREME ULTRAVIOLET MASK AND METHOD OF MANUFACTURING THE SAME

CROSS-REFERENCE TO RELATED APPLICATION

The present application claims priority to and incorporates by reference U.S. Provisional Application 62/565,714 filed on Sep. 29, 2017 in its entirety.

TECHNICAL FIELD

The present disclosure is related to extreme ultraviolet EUV masks and methods of manufacturing the masks. In particular, the present disclosure is related to protection of black borders of the EUV mask from being damaged during manufacturing of the EUV mask.

BACKGROUND

In EUV photolithography, the EUV light rays emitted from a plasma are reflected off a collector mirror, directed toward a patterned EUV mask, and reflected off the mask onto the target substrate. An EUV reflective mask includes a substrate, an EUV reflective multilayered structure, and an EUV absorbing layer ('absorber'). The EUV absorbing layer is patterned by etching and photolithographic techniques to expose the underneath EUV reflecting layers for EUV photolithographic patterning of desired patterns on the target substrate while the EUV absorbing layers absorb the EUV light rays so as not to pattern the target substrate in the undesired regions. Therefore, the thickness of the EUV absorbing layer, the thickness of each of the layers in the EUV reflective multilayered structure, surface roughness of the above layers, and the homogeneity of the material properties throughout the layers, are extremely important to the quality of EUV light irradiating the target substrate. In industrial practice, off-axis illumination or other factors can cause a shadow effect on the target substrate and variations in the thickness of the EUV light absorbing layer can affect the proper functioning of the combination of the EUV light absorbing layer and the EUV reflecting multi-layered structure.

A 'black border' is formed at the edge of the desired patterns of the EUV reflective mask to avoid over-exposure of the edge of the patterns. The 'black border' is a non-reflective trench of a sufficient depth for destructive interference to solve the problem of shadow effect by making the borders non-reflecting (optically 'black'). During the processing of extreme ultraviolet masks, black borders can be damaged. Undercut etching of the silicon layers in the Mo/Si multilayer in the black border can occur because of the difference in etch selectivity of Mo and Si. Mo has a higher etch selectivity compared to Si. Hydrogen can preferentially etch Si, undercutting the Mo layers. In addition, Mo nanocrystal aggregation can occur, forming spherical particles that can contaminate the mask. An improved EUV mask and method of making EUV masks is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows a process stage of a method of manufacturing an EUV mask according to an embodiment of the present disclosure.

FIG. 4 shows a process stage of the method of manufacturing the EUV mask according to an embodiment of the present disclosure.

FIG. 5 shows a process stage of the method of manufacturing the EUV mask according to an embodiment of the present disclosure.

FIG. 6 shows a process stage of the method of manufacturing the EUV mask according to an embodiment of the present disclosure.

FIG. 7 shows a process stage of the method of manufacturing the EUV mask according to an embodiment of the present disclosure.

FIG. 8 shows a process stage of the method of manufacturing the EUV mask according to an embodiment of the present disclosure.

FIG. 9 shows a process stage of the method of manufacturing the EUV mask according to an embodiment of the present disclosure.

FIG. 14 shows a process stage of a method of manufacturing an EUV mask according to an embodiment of the present disclosure.

FIG. 15 shows a process stage of the method of manufacturing the EUV mask according to an embodiment of the present disclosure.

FIG. 16 shows a process stage of the method of manufacturing the EUV mask according to an embodiment of the present disclosure.

FIG. 21 shows a process stage of the method of manufacturing the EUV mask according to an embodiment of the present disclosure.

FIG. 22 shows a process stage of the method of manufacturing the EUV mask according to an embodiment of the present disclosure.

FIG. 23 shows a process stage of the method of manufacturing the EUV mask according to an embodiment of the present disclosure.

FIG. 24 shows a process stage of the method of manufacturing the EUV mask according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit a EUV light ray with wavelength of 13.5 nm. Because this wavelength is also in the x-ray radiation wavelength region, the EUV radiation source is also called a soft x-ray radiation source. The EUV light rays are emitted from a laser-produced plasma (LPP) are collected by a collector mirror and reflected toward a patterned mask.

Figure 1:
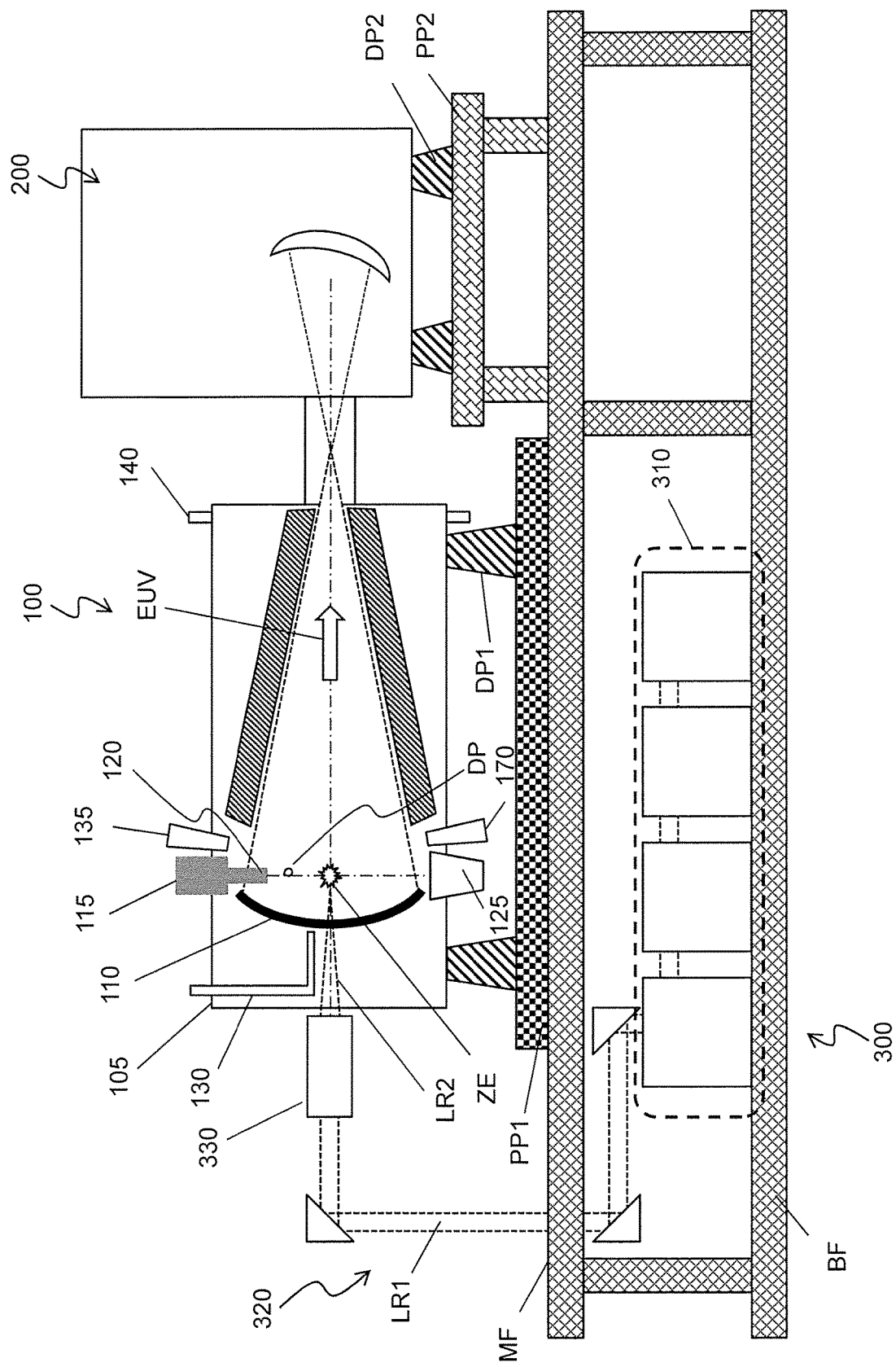
FIG. 1 shows an extreme ultraviolet lithography tool according to an embodiment of the disclosure.

FIG. 1 is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
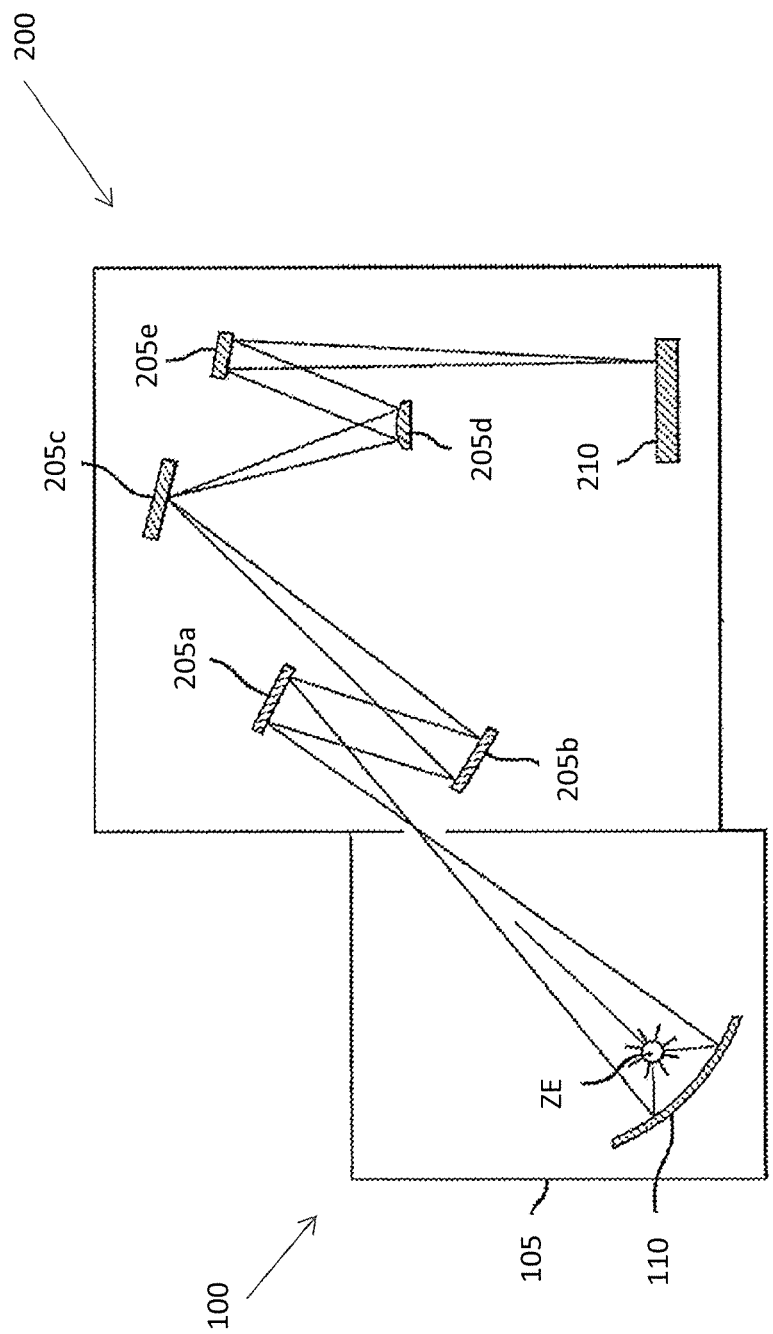
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the patterning optic 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask 205c may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (µm) to about 100 µm. For example, in an embodiment, the target droplets DP are tin droplets, having a diameter of about 10 µm to about 100 µm. In other embodiments, the target droplets DP are tin droplets having a diameter of about 25 µm to about 50 µm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

FIGS. 3-13 show a process of manufacturing an EUV mask according to an embodiment of the present disclosure. FIG. 3 shows an extreme ultraviolet (EUV) mask blank according to an embodiment of the present disclosure. The EUV mask blank includes a multilayered stack 20 of molybdenum layers 17 and silicon layers 19 ('Mo/Si stack 20'). The Mo/Si stack 20 includes alternating Mo layers 17 and Si layers 19 disposed over a first major surface of a mask substrate 10. A capping layer 25 is disposed over the Mo/Si stack 20, and an EUV absorbing layer or absorber 30 is disposed over the capping layer 25. An anti-reflection layer 35 is disposed over the EUV absorbing layer 30. A hard mask layer 40 is formed over the EUV absorbing layer 30. A first photoresist layer 45 is formed over the hard mask layer 40.

In the embodiment shown in FIG. 3, a conductive backside coating layer 15 is optionally deposited on the second major surface of the mask substrate 10 opposite to the first major surface. The conductive backside coating layer 15 is used to fix the mask for photolithographic operation by electrostatic chucking in some embodiments. In an embodiment, the conductive layer 15 is formed of a ceramic compound including chromium nitride or any suitable material for electrostatic chucking of the mask.

The mask substrate 10 is made of a low thermal expansion glass material including titanium oxide doped silicon dioxide, or any other suitable low thermal expansion materials such as quartz, silicon, silicon carbide, black diamond, and/or other low thermal expansion substances known in the art that can minimize the image distortion due to mask heating in the EUV photolithographic environment, in some embodiments of the present disclosure. The mask substrate 10 has a low defect level, such as a high purity single crystal substrate, and a low level of surface roughness, as measured using an atomic force microscope.

The multilayered stack 20 of alternating Mo layers 17 and Si layers 19 deposited over the mask substrate 10 provides Fresnel resonant reflections across the interfaces between the Mo layer and Si layer of different refractive indices by use of an appropriate thickness for each layer inside the multilayer in some embodiments of the present disclosure. High quality reflections rely on constructive interference by phase-matching and intensity adding-up of light rays reflected from different layers. The thickness of the layers depends on the wavelength of the incident light and the angle of incidence to the EUV mask. For a specific angle of incidence, the thickness of each of the layers of the multilayered stack 20 is chosen to achieve maximal constructive interference for light reflected at different interfaces of the multilayered stack 20. Thus, even thickness and low surface roughness of each of the layers in the multilayered stack 20 are required for high quality Fresnel resonant reflections. A thickness of each of the layers in the multilayered stack 20 is 5-7 nm in some embodiments of the present disclosure.

In some embodiments of the present disclosure, the multilayered stack 20 includes alternating molybdenum layers 17 and beryllium layers 19. In some embodiments of the present disclosure, the number of layers in the multilayered stack 20 is in a range from 20 to 100 although any number of layers is allowed as long as sufficient reflectivity is maintained for imaging the target substrate. In some embodiments, the reflectivity is higher than about 70%. In some embodiments of the present disclosure, the Mo/Si multilayer stack 20 includes about 30 to about 60 alternating layers of Mo and Si. In other embodiments of the present disclosure, the Mo/Si multilayer stack 20 includes about 40 to about 50 alternating layers each of Mo and Si.

Methods of forming the layers of the multilayered stack 20 include physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The capping layer 25 formed over the multilayered stack 20 prevents oxidation of the multilayered stack 20 in some embodiments. In some embodiments of the present disclosure, the capping layer 25 is formed of a material including silicon and ruthenium. In some embodiments of the present disclosure, the capping layer 25 has a thickness of about 7 nm. Methods of forming the capping layer 25 include physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

The EUV absorbing layer or absorber 30 formed over the capping layer 25 absorbs radiation with wavelength in a range of EUV wavelengths. The EUV absorbing layer 30 is formed of a single layer or multiple layers in some embodiments of the present disclosure. In some embodiments of the present disclosure, the EUV absorbing layer 30 is formed of a material including a tantalum compound. In some embodiments of the present disclosure, the EUV absorbing layer 30 is made of TaN or TaBN. In some embodiments of the present disclosure, the material used to make the EUV absorbing layer 30 also includes molybdenum, palladium, zirconium, nickel silicide, titanium, titanium nitride, chromium, chromium oxide, aluminum oxide, aluminum-copper alloy, or other suitable materials. The thickness of the EUV absorbing layer 30 is not limited as long as the overall reflectivity of the EUV mask is more than 70%.

Methods of forming the EUV absorbing layer or absorber 30 include physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

The anti-reflection layer 35 disposed over the EUV absorbing layer 30 is formed of a material including $SiO_2$, SiN, TaBO, TaO$_5$, Cr$_2$O$_3$, ITO (indium tin oxide), or any suitable material, in some embodiments of the present disclosure. The anti-reflection layer 35 reduces reflections of photolithographic radiation. Methods of forming the anti-reflection layer 35 include physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

The hard mask layer 40 formed over the anti-reflection layer 35 is formed of a material including silicon nitride in some embodiments of the present disclosure. Methods of forming the hard mask layer 40 include physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

The first photoresist layer 45 formed over the hard mask layer 40 is formed of a material including a photosensitive resist coating material. The first photoresist layer 45 is coated onto the hard mask layer 40 by a spin coating technique followed by baking in some embodiments.

FIG. 4 shows the formation of a pattern in the first photoresist layer 45. After formation of the embodiment in FIG. 3, the first photoresist layer 45 is subsequently patterned using photolithographic techniques to form a photoresist pattern 50, as shown in FIG. 4. The photoresist pattern 50 is extended into hard mask layer 40 to form a hard mask layer pattern 50' using suitable etching techniques such as a dry etch, a wet etch, or a combination of the dry etch with the wet etch, as shown in FIG. 5. Next, as shown in FIG. 6, the hard mask layer pattern 50' is extended through the anti-reflection layer 35 and EUV absorbing layer 30 using suitable etching techniques such as a dry etch, a wet etch, or a combination of the dry etch and the wet etch exposing the capping layer 25 and forming mask pattern 50", and the photoresist pattern 50 is removed as shown in FIG. 6.

As shown in FIG. 7, the hard mask layer 40 is subsequently removed in some embodiments using suitable etching techniques such as a dry etch, a wet etch, or a combination of the dry etch with the wet etch.

A second photoresist layer 55 is subsequently formed over the mask pattern 50" and the anti-reflection layer 35, as shown in FIG. 8. The second photoresist layer 55 is selectively exposed to actinic radiation to form a latent pattern 60 surrounding the mask pattern in the second photoresist layer, as shown in FIG. 9. In some embodiments, the second photoresist layer 55 is a positive photoresist.

Figure 10:
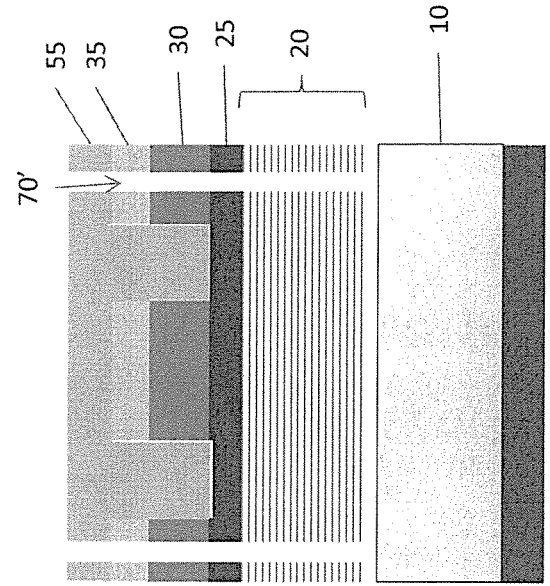
FIG. 10 shows a process stage of the method of manufacturing the EUV mask according to an embodiment of the present disclosure.
Figure 11:
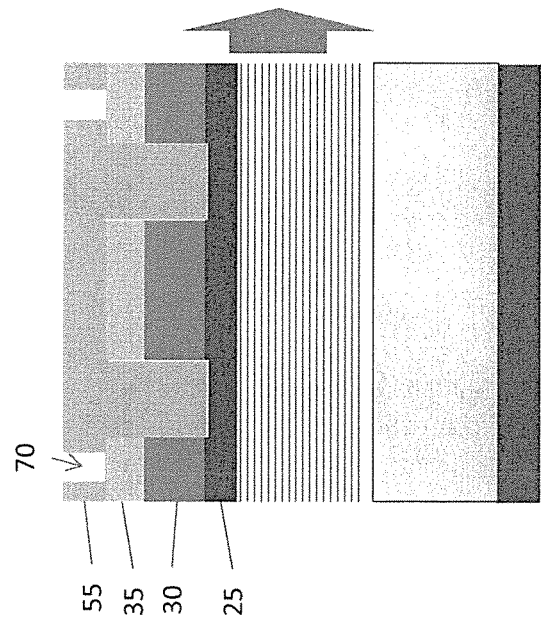
FIG. 11 shows a process stage of the method of manufacturing the EUV mask according to an embodiment of the present disclosure.

In FIG. 10, the second photoresist layer is developed forming a border pattern 70 in the second photoresist layer 55. The border pattern 70 is subsequently extended through the anti-reflection layer 35, absorber layer 30, capping layer 25, Mo/Si multilayer stack 20 using suitable etching techniques such as a dry etch, a wet etch, or a combination of the dry etch and the wet etch to expose portions of the mask substrate 10, thereby forming a trench 70' (called 'black border' or 'black border trench') surrounding the mask pattern, as shown in FIG. 11.

Figure 12:
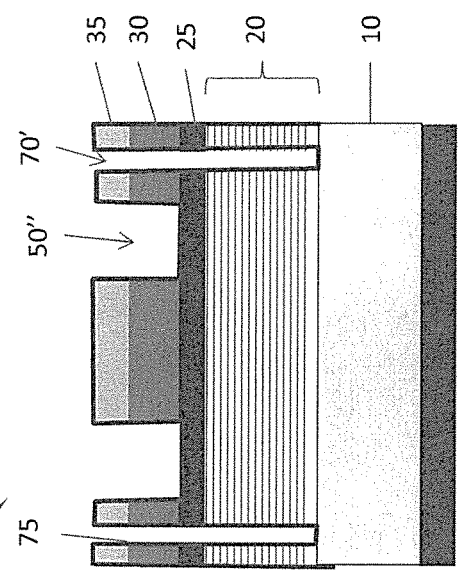
FIG. 12 shows a process stage of the method of manufacturing the EUV mask according to an embodiment of the present disclosure.

Next as shown in FIG. 12, the second photoresist layer 55 is removed using a suitable photoresist stripping technique.

Figure 13:
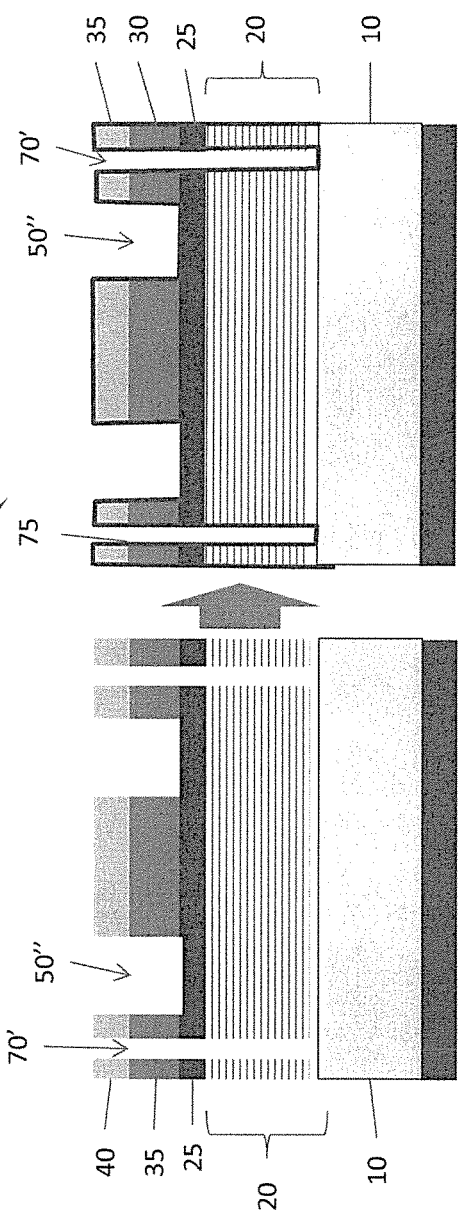
FIG. 13 shows a process stage of the method of manufacturing the EUV mask according to an embodiment of the present disclosure.

The trench 70' (black border) is formed in the multilayered Mo/Si stack 20 surrounding the mask pattern 50" using suitable etching techniques and a passivation layer 75 is subsequently disposed along sidewalls of the trench 70', as shown in FIG. 13. The passivation layer 75 subsequently formed along sidewalls of the trench 70' and over the mask pattern 50" protects the mask pattern 50" and sidewalls of the Mo/Si multilayer stack 20 from defects and damage during processes performed subsequent to the formation of the passivation layer 75.

In some embodiments of the present disclosure, the forming of the passivation layer 75 is formed by exposing the sidewalls of the trench to a nitrogen-based gas. In some embodiments, the nitrogen-based gas is selected from the group consisting of N$_2$, NH$_3$, N$_2$H$_2$, and NO$_2$. In some embodiments, nitrogen-based plasma is used to form the passivation layer. In some embodiments, forming the passivation layer comprises a sol-gel process or a photochemical reaction.

In some embodiments of the present disclosure, the passivation layer 75 includes a high-k material. In other embodiments of the present disclosure, the passivation layer 75 includes a material with high ultraviolet absorbance, including nickel and cobalt. In some embodiments of the present disclosure, the passivation layer 75 is made of silicon nitride, silicon oxynitride, or a metal doped silicon nitride. In some embodiments of the present disclosure, the passivation layer has a thickness of less than about 10 nm.

FIGS. 14-24 show a process of manufacturing an EUV mask according to another embodiment of the present disclosure. FIG. 14 shows an extreme ultraviolet (EUV) mask blank according to an embodiment of the present disclosure. The EUV mask blank includes a multilayered stack 20 of molybdenum layers 17 and silicon layers 19 ('Mo/Si stack 20'). The Mo/Si stack 20 includes alternating Mo layers 17 and Si layers 19 disposed over a first major surface of a mask substrate 10. A capping layer 25 is disposed over the Mo/Si stack 20, and an EUV absorbing layer or absorber 30 is disposed over the capping layer 25. An anti-reflection layer 35 is disposed over the EUV absorbing layer 30. A hard mask layer 40 is formed over the EUV absorbing layer 30. A first photoresist layer 45 is formed over the hard mask layer 40.

In the embodiment shown in FIG. 14, a conductive backside coating layer 15 is optionally deposited on the second major surface of the mask substrate 10 opposite to the first major surface. The conductive backside coating layer 15 is used to fix the mask for photolithographic operation by electrostatic chucking in some embodiments. In an embodiment, the conductive layer 15 is formed of a ceramic compound including chromium nitride or any suitable material for electrostatic chucking of the mask.

The mask substrate 10 is made of a low thermal expansion glass material including titanium oxide doped silicon dioxide, or any other suitable low thermal expansion materials such as quartz, silicon, silicon carbide, black diamond, and/or other low thermal expansion substances known in the art that can minimize the image distortion due to mask heating in the EUV photolithographic environment, in some embodiments of the present disclosure. The mask substrate 10 has a low defect level, such as a high purity single crystal substrate, and a low level of surface roughness, as measured using an atomic force microscope.

The multilayered stack 20 of alternating Mo layers 17 and Si layers 19 deposited over the mask substrate 10 provides Fresnel resonant reflections across the interfaces between the Mo layer and Si layer of different refractive indices by use of an appropriate thickness for each layer inside the multilayer in some embodiments of the present disclosure. High quality reflections rely on constructive interference by phase-matching and intensity adding-up of light rays reflected from different layers. The thickness of the layers depends on the wavelength of the incident light and the angle of incidence to the EUV mask. For a specific angle of incidence, the thickness of each of the layers of the multi-layered stack 20 is chosen to achieve maximal constructive interference for light reflected at different interfaces of the multilayered stack 20. Thus, even thickness and low surface roughness of each of the layers in the multilayered stack 20 are required for high quality Fresnel resonant reflections. A thickness of each of the layers in the multilayered stack 20 is 5-7 nm in some embodiments of the present disclosure.

In some embodiments of the present disclosure, the multilayered stack 20 includes alternating molybdenum layers 17 and beryllium layers 19. In some embodiments of the present disclosure, the number of layers in the multilayered stack 20 is in a range from 20 to 100 although any number of layers is allowed as long as sufficient reflectivity is maintained for imaging the target substrate. In some embodiments, the reflectivity is higher than about 70%. In some embodiments of the present disclosure, the Mo/Si multilayer stack 20 includes about 30 to about 60 alternating layers of Mo and Si. In other embodiments of the present disclosure, the Mo/Si multilayer stack 20 includes about 40 to about 50 alternating layers each of Mo and Si The method to form the layers of the multilayered stack 20 includes physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The capping layer 25 formed over the multilayered stack 20 prevents oxidation of the multilayered stack 20 in some embodiments. In some embodiments of the present disclosure, the capping layer 25 is formed of a material including silicon and ruthenium. In some embodiments of the present disclosure, the capping layer 25 has a thickness of about 7 nm. The method to form the capping layer 25 includes physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The EUV absorbing layer or absorber 30 formed over the capping layer 25 absorbs radiation with wavelength in a range of EUV wavelengths. The EUV absorbing layer 30 is formed of a single layer or multiple layers in some embodiments of the present disclosure. In some embodiments of the present disclosure, the EUV absorbing layer 30 is formed of a material including a tantalum compound. In some embodiments of the present disclosure, the EUV absorbing layer 30 is made of TaN or TaBN. In some embodiments of the present disclosure, the material used to make the EUV absorbing layer 30 also includes molybdenum, palladium, zirconium, nickel silicide, titanium, titanium nitride, chromium, chromium oxide, aluminum oxide, aluminum-copper alloy, or other suitable materials. The thickness of the EUV absorbing layer 30 is not limited as long as the overall reflectivity of the EUV mask is more than 70%.

The method to form the EUV absorbing layer or absorber 30 includes physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The anti-reflection layer 35 disposed over the EUV absorbing layer 30 is formed of a material including $SiO_2$, SiN, TaBO, $TaO_5$, $Cr_2O_3$, ITO, or any suitable material, in some embodiments of the present disclosure. The anti-reflection layer 35 reduces reflection of lithographic radiation. The method to form the anti-reflection layer 35 includes physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The hard mask layer 40 formed over the anti-reflection layer 35 is formed of a material including silicon nitride in some embodiments of the present disclosure. The method to form the hard mask layer 40 includes physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The first photoresist layer 45 formed over the hard mask layer 40 is formed of a material including a photosensitive resist coating material. The first photoresist layer 45 is coated onto the hard mask layer 40 by a spin coating technique followed by baking in some embodiments.

FIG. 15 shows the formation of a pattern in the first photoresist layer 45. After formation of the embodiment in FIG. 14, the first photoresist layer 45 is subsequently patterned using photolithographic techniques to form a photoresist pattern 50, as shown in FIG. 15. The photoresist pattern 50 is extended into hard mask layer 40 to form a hard mask layer pattern 50' using suitable etching techniques such as a dry etch, a wet etch, or a combination of the dry etch and the wet etch, as shown in FIG. 16.

Figure 17:
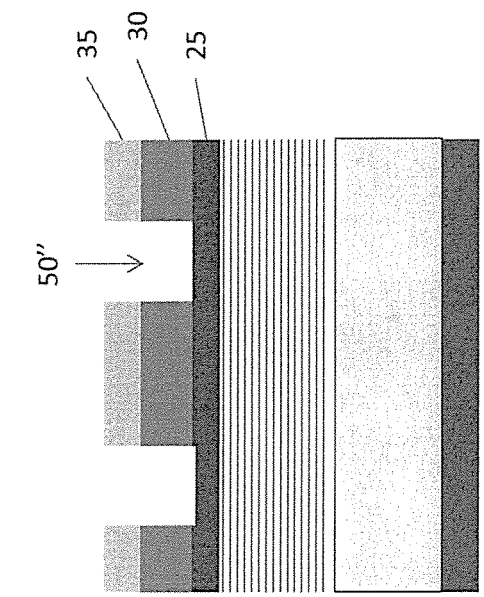
FIG. 17 shows a process stage of the method of manufacturing the EUV mask according to an embodiment of the present disclosure.
Figure 18:
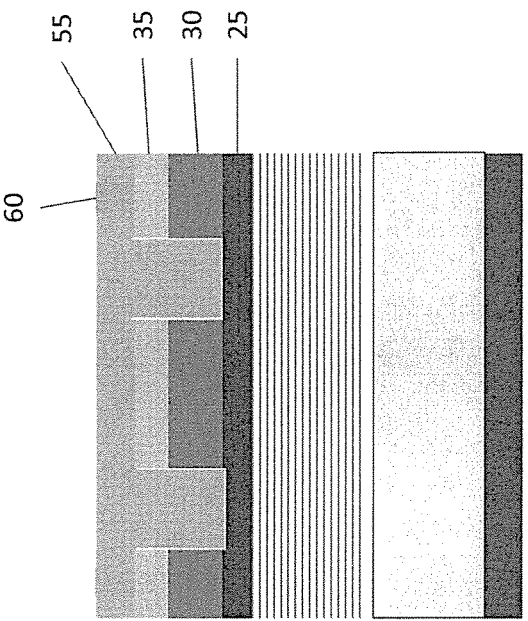
FIG. 18 shows a process stage of the method of manufacturing the EUV mask according to an embodiment of the present disclosure.

Next, as shown in FIG. 17, the hard mask layer pattern 50' is extended through the anti-reflection layer 35 and EUV absorbing layer 30 using suitable etching techniques such as a dry etch, a wet etch, or a combination of the dry etch and the wet etch exposing the capping layer 25 and forming mask pattern 50", and the photoresist pattern 50 is removed as shown in FIG. 17. As shown in FIG. 18, the hard mask layer 40 is subsequently removed in some embodiments using suitable etching techniques such as a dry etch, a wet etch, or a combination of the dry etch and the wet etch.

Figure 19:
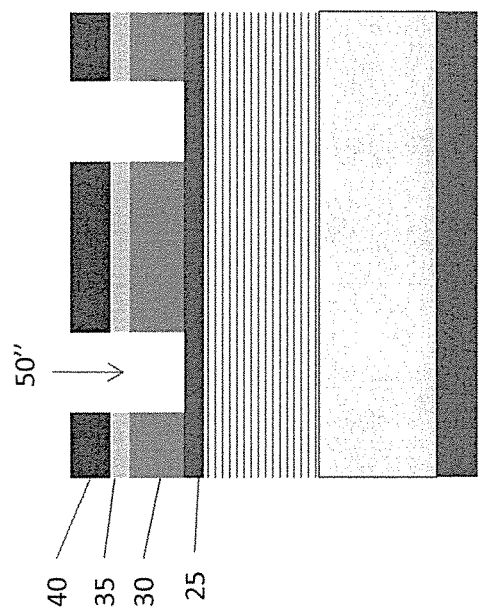
FIG. 19 shows a process stage of the method of manufacturing the EUV mask according to an embodiment of the present disclosure.
Figure 20:
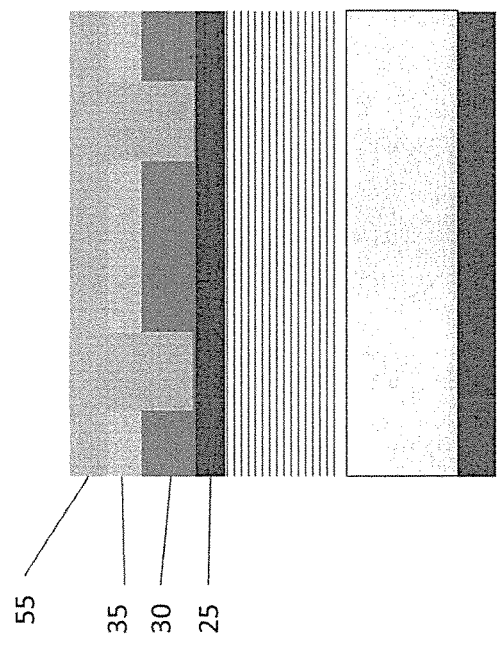
FIG. 20 shows a process stage of the method of manufacturing the EUV mask according to an embodiment of the present disclosure.

A second photoresist layer 55 is subsequently formed over the mask pattern 50" and the anti-reflection layer 35, as shown in FIG. 19. The second photoresist layer 55 is selectively exposed to actinic radiation to form a latent pattern 60 surrounding the mask pattern in the second photoresist layer, as shown in FIG. 20. In some embodiments, the second photoresist layer 55 is a positive photoresist.

In FIG. 21, the second photoresist layer is developed forming a border pattern 70 in the second photoresist layer 55. The border pattern 70 is subsequently extended through the anti-reflection layer 35, absorber layer 30, capping layer 25, Mo/Si multilayer stack 20 using suitable etching techniques such as a dry etch, a wet etch, or a combination of the dry etch and the wet etch to expose portions of the mask substrate 10, thereby forming a trench 70' (called 'black border' or 'black border trench') surrounding the mask pattern, as shown in FIG. 22.

Next as shown in FIG. 23, a passivation layer 75 is subsequently disposed along sidewalls of the trench 70'. The passivation layer 75 formed along sidewalls of the trench 70' and over the mask pattern 50" protects the mask pattern 50" using suitable etching techniques and sidewalls of the Mo/Si multilayer stack 20 from defects and damage during subsequent processing.

Subsequently, the second photoresist layer 55 is removed using a suitable photoresist stripping technique (FIG. 24). After the second photoresist removal, at least a portion of the passivation layer 75 remains along the trench 70' sidewalls (FIG. 24).

In some embodiments of the present disclosure, the forming of the passivation layer 75 is formed by exposing the sidewalls of the trench to a nitrogen-based gas. In some embodiments, the nitrogen-based gas is selected from the group consisting of $N_2$, $NH_3$, $N_2H_2$, and $NO_2$. In some embodiments, nitrogen-based plasma is used to form the passivation layer. In some embodiments, forming the passivation layer comprises a sol-gel process or a photochemical reaction.

In some embodiments of the present disclosure, the passivation layer 75 includes a high-k material. In other embodiments of the present disclosure, the passivation layer 75 includes a material with high ultraviolet absorbance, including nickel and cobalt. In some embodiments of the present disclosure, the passivation layer 75 is made of silicon nitride, silicon oxynitride, or a metal doped silicon nitride. In some embodiments of the present disclosure, the passivation layer has a thickness of less than about 10 nm.

Figure 25:
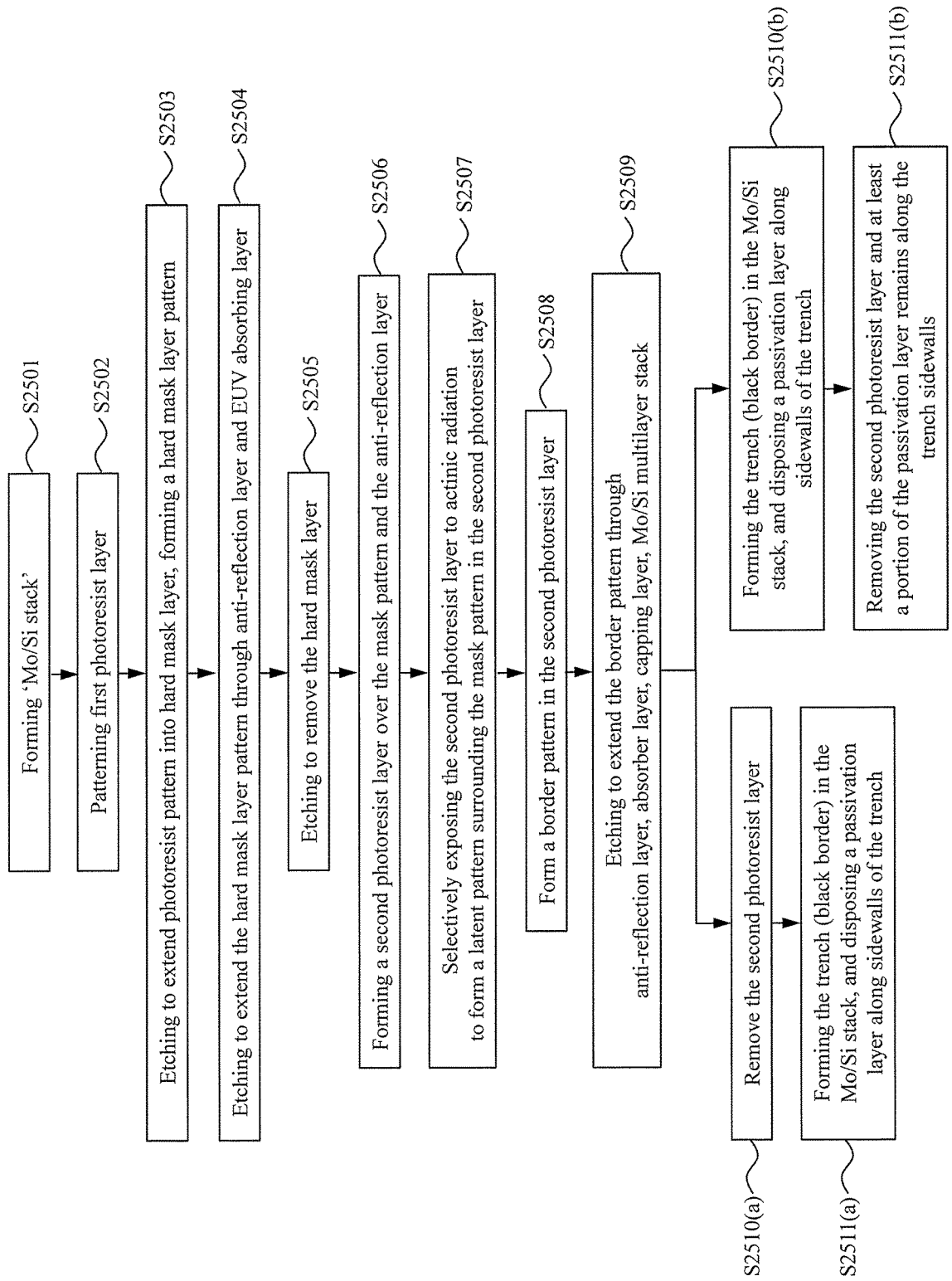
FIG. 25 shows a flowchart showing the methods of manufacturing an EUV mask according to embodiments of the present disclosure.

FIG. 25 shows a flowchart showing methods of manufacturing an EUV mask according to the embodiments shown in FIGS. 3-13 and FIGS. 14-24. In FIG. 25, step S2501 includes a process of forming a multilayered stack of molybdenum layer and silicon layer (also called 'Mo/Si stack'). The Mo/Si stack includes alternating Mo layers and Si layers disposed over a first major surface of a mask substrate. A capping layer is disposed over the Mo/Si stack, and an EUV absorbing layer or absorber is disposed over the capping layer. An anti-reflection layer is disposed over the EUV absorbing layer. A hard mask layer is formed over the EUV absorbing layer. A first photoresist layer is formed over the hard mask layer. The multilayered stack of molybdenum layer and silicon layer is formed using physical vapor deposition (PVD) processes such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

After step S2501, step 2502 is carried out to pattern the first photoresist layer using photolithographic techniques to form a photoresist pattern.

After step S2502, step S2503 is carried out to extend the photoresist pattern into the hard mask layer to form a hard mask layer pattern using suitable etching techniques such as a dry etch, a wet etch, or a combination of the dry etch and the wet etch.

After step S2503, step S2504 is carried out to extend the hard mask layer pattern through the anti-reflection layer and EUV absorbing layer using suitable etching techniques such as a dry etch, a wet etch, or a combination of the dry etch with the wet etch, thereby exposing the capping layer and forming mask pattern, and the photoresist pattern is removed.

After step S2504, step 2505 is carried out to remove the hard mask layer using suitable etching techniques such as dry etch or wet etch or a combination of the dry etch and the wet etch.

After step S2505, step 2506 is carried out to form a second photoresist layer over the mask pattern and the anti-reflection layer.

After step S2506, step 2507 is carried out to selectively expose the second photoresist layer to actinic radiation to form a latent pattern surrounding the mask pattern in the second photoresist layer. In some embodiments, the second photoresist layer is a positive photoresist.

After step S2507, step 2508 is carried out to develop the second photoresist layer to form a border pattern in the second photoresist layer.

After step S2508, step 2509 is carried out to extend the border pattern through the anti-reflection layer, absorber layer, capping layer, Mo/Si multilayer stack using suitable etching techniques such as a dry etch or wet etch or a combination of the dry etch with the wet etch to expose portions of the mask substrate, thereby forming a trench ('black border' or 'black border trench') surrounding the mask pattern.

In some embodiments, after step S2509, step 2510(a) is carried out to remove the second photoresist layer using a suitable photoresist stripping technique.

After step S2510(a), step 2511(a) is carried out to form the trench (black border) is formed in the multilayered Mo/Si stack surrounding the mask pattern, and a passivation layer is subsequently disposed along sidewalls of the trench. The passivation layer subsequently formed along sidewalls of the trench and over the mask pattern protects the mask pattern and sidewalls of the Mo/Si multilayer stack from defects and damage during processes performed subsequent to the formation of the passivation layer.

Alternatively, in another embodiment, after step S2509, step 2510(b) is carried out to form the trench (black border) in the multilayered Mo/Si stack surrounding the mask pattern, and a passivation layer is subsequently disposed along sidewalls of the trench. The passivation layer subsequently formed along sidewalls of the trench and over the mask pattern protects the mask pattern and sidewalls of the Mo/Si multilayer stack from defects and damage during processes performed subsequent to the formation of the passivation layer.

After step S2510(b), step 2511(b) is carried out to remove the second photoresist layer using a suitable photoresist stripping technique. After the second photoresist removal, at least a portion of the passivation layer remains along the trench sidewalls.

Embodiments of the present disclosure prevent black border defect issues, such as those caused by undercut etching of the silicon layers. In addition, embodiments of the present disclosure prevent the formation of spherical Mo particles. The passivation layer 75 is formed along black border sidewalls to protect the exposed edges of the Mo and Si layers. For example, in some embodiments, Si—N bonds are formed during the formation of the passivation layer. The Si—N bonds can prevent hydrogen radical etching of the silicon.

It will be understood that not all advantages have been necessarily discussed herein, no particular advantage is required for all embodiments or examples, and other embodiments or examples may offer different advantages.

According to an embodiment of the present disclosure, a method of manufacturing an extreme ultraviolet mask, includes forming a multilayer Mo/Si stack including alternating Mo and Si layers over a first major surface of a mask substrate, and forming a capping layer over the multilayer Mo/Si stack. An absorber layer is formed on the capping layer, a hard mask layer is formed over the absorber layer. The hard mask layer is patterned to form a hard mask layer pattern. The hard mask layer pattern is extended into the absorber layer to expose the capping layer and form a mask pattern. A border pattern is formed around the mask pattern. The border pattern is extended through the multilayer Mo/Si stack to expose the mask substrate and form a trench surrounding the mask pattern. A passivation layer is formed along sidewalls of the trench. In some embodiments of the present disclosure, the method includes forming a conductive backside coating layer over a second major surface of the mask substrate opposing the first major surface. In some embodiments of the present disclosure, the method includes forming an anti-reflection layer over the absorber layer. In some embodiments of the present disclosure, the method includes removing the hard mask layer after forming the mask pattern. In some embodiments of the present disclosure, the method includes forming a first photoresist layer over the hard mask layer. In some embodiments of the present disclosure, the method includes forming a second photoresist layer over the absorber layer and the mask pattern. In some embodiments of the present disclosure, the forming a passivation layer includes exposing the sidewalls of the trench to a nitrogen-based gas selected from the group consisting of $N_2$, $NH_3$, $N_2H_2$, and $NO_2$.

According to another embodiment of the present disclosure, a method of manufacturing an extreme ultraviolet mask, includes patterning an absorber layer disposed over a multilayer Mo/Si stack including alternating Mo and Si layers disposed over a first major surface of a mask substrate to form a mask pattern. A border pattern is formed around the mask pattern. The border pattern is extended through the multilayer Mo/Si stack to expose the mask substrate and form a trench surrounding the mask pattern. A passivation layer is formed over the mask pattern and along sidewalls of the trench. In some embodiments of the present disclosure, the method includes forming a capping layer over the Mo/Si stack. In some embodiments of the present disclosure, the method includes forming a hard mask layer over the absorber layer, patterning the hard mask layer to form a hard mask layer pattern, and extending the hard mask layer pattern into the absorber layer to form the mask pattern. In some embodiments of the present disclosure, the method includes forming a photoresist layer over the absorber layer and the mask pattern. In some embodiments of the present disclosure, the method includes removing the photoresist layer before forming the passivation layer. In some embodiments of the present disclosure, the passivation layer is formed over the photoresist layer. In some embodiments of the present disclosure, the forming the passivation layer includes exposing the sidewalls of the trench and the mask pattern to a nitrogen-based gas selected from the group consisting of $N_2$, $NH_3$, $N_2H_2$, and $NO_2$.

According to another embodiment of the present disclosure, an extreme ultraviolet mask, includes a multilayer Mo/Si stack including alternating Mo and Si layers disposed over a first major surface of a mask substrate. A capping layer is disposed over the Mo/Si stack, and an absorber layer is disposed over the capping layer. A mask pattern is formed in the absorber layer. A trench formed in the multilayer Mo/Si stack surrounds the mask pattern, and a passivation layer is disposed along sidewalls of the trench. In some embodiments of the present disclosure, the extreme ultraviolet mask further includes an anti-reflection layer disposed over the absorber layer. In some embodiments of the present disclosure, the passivation layer is made of a silicon nitride, a silicon oxynitride, or a metal doped silicon nitride. In some embodiments of the present disclosure, the passivation layer has a thickness of less than about 10 nm. In some embodiments of the present disclosure, the passivation layer includes a high-k material. In some embodiments of the present disclosure, the passivation layer includes nickel or cobalt.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an extreme ultraviolet mask, comprising:
    forming a multilayer Mo/Si stack comprising alternating Mo and Si layers over a first major surface of a mask substrate made of a glass material;
    forming a capping layer over the multilayer Mo/Si stack;
    forming an absorber layer on the capping layer;
    forming a hard mask layer over the absorber layer;
    patterning the hard mask layer to form a hard mask layer pattern;
    extending the hard mask layer pattern into the absorber layer to expose the capping layer and forming a mask pattern;
    forming a border pattern around the mask pattern;
    extending the border pattern through the multilayer Mo/Si stack to expose the first major surface of the mask substrate and forming a trench surrounding the mask pattern; and
    forming a passivation layer along sidewalls of the trench and in direct contact with the first major surface of the mask substrate.

2. The method according to claim 1, further comprising forming a conductive backside coating layer over a second major surface of the mask substrate opposing the first major surface.

3. The method according to claim 1, further comprising forming an anti-reflection layer over the absorber layer.

4. The method according to claim 1, further comprising removing the hard mask layer after forming the mask pattern.

5. The method according to claim 1, further comprising forming a first photoresist layer over the hard mask layer.

6. The method according to claim 5, further comprising forming a second photoresist layer over the absorber layer and the mask pattern.

7. The method according to claim 1, wherein the forming a passivation layer comprises exposing the sidewalls of the trench to a nitrogen-based gas selected from the group consisting of $N_2$, $NH_3$, $N_2H_2$, and $NO_2$.

8. A method of manufacturing an extreme ultraviolet mask, comprising:
patterning an absorber layer disposed over a multilayer Mo/Si stack comprising alternating Mo and Si layers disposed over a first major surface of a mask substrate made of a glass material to form a mask pattern;
forming a border pattern around the mask pattern;
extending the border pattern through the multilayer Mo/Si stack to expose the first major surface of the mask substrate and forming a trench surrounding the mask pattern; and
forming a passivation layer over the mask pattern, along sidewalls of the trench, and in direct contact with the first major surface of the mask substrate.

9. The method according to claim 8, further comprising forming a capping layer over the Mo/Si stack.

10. The method according to claim 9, further comprising forming a hard mask layer over the absorber layer;
patterning the hard mask layer to form a hard mask layer pattern; and
extending the hard mask layer pattern into the absorber layer to form the mask pattern.

11. The method according to claim 10, further comprising forming a photoresist layer over the absorber layer and the mask pattern.

12. The method according to claim 11, further comprising removing the photoresist layer before forming the passivation layer.

13. The method according to claim 11, wherein the passivation layer is formed over the photoresist layer.

14. The method according to claim 8, wherein the forming the passivation layer comprises exposing the sidewalls of the trench and the mask pattern to a nitrogen-based gas selected from the group consisting of $N_2$, $NH_3$, $N_2H_2$, and $NO_2$.

15. An extreme ultraviolet mask, comprising:
a multilayer Mo/Si stack comprising alternating Mo and Si layers disposed over a first major surface of a mask substrate made of a glass material;
a capping layer disposed over the Mo/Si stack;
an absorber layer disposed over the capping layer;
a mask pattern formed in the absorber layer;
a trench formed in the multilayer Mo/Si stack surrounding the mask pattern, the trench exposing the first major surface of the mask substrate; and
a passivation layer disposed along sidewalls of the trench and in direct contact with the first major surface of the mask substrate.

16. The extreme ultraviolet mask according to claim 15, further comprising an anti-reflection layer disposed over the absorber layer.

17. The extreme ultraviolet mask according to claim 15, wherein the passivation layer is made of a silicon nitride, a silicon oxynitride, a metal doped silicon nitride, or a composite including at least one of metal silicide, metal nitride and metal oxide.

18. The extreme ultraviolet mask according to claim 15, wherein the passivation layer has a thickness of less than about 10 nm.

19. The extreme ultraviolet mask according to claim 15, wherein the passivation layer comprises a high-k material.

20. The extreme ultraviolet mask according to claim 15, wherein the passivation layer comprises nickel or cobalt.

* * * * *